United States Patent
Fan et al.

(10) Patent No.: US 11,754,629 B2
(45) Date of Patent: Sep. 12, 2023

(54) ACTIVE ISOLATION DETECTION USING ADAPTIVE BIAS RESISTANCE

(71) Applicant: GM GLOBAL TECHNOLOGY OPERATIONS LLC, Detroit, MI (US)

(72) Inventors: Yue Fan, Troy, MI (US); Shifang Li, Shelby Township, MI (US); Russell K. Steele, Clinton Township, MI (US); James E. Tarchinski, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 613 days.

(21) Appl. No.: 16/533,180

(22) Filed: Aug. 6, 2019

(65) Prior Publication Data
US 2021/0041505 A1    Feb. 11, 2021

(51) Int. Cl.
*G01R 31/36*    (2020.01)
*G01R 31/385*    (2019.01)
*G01R 31/364*    (2019.01)

(52) U.S. Cl.
CPC ....... *G01R 31/3648* (2013.01); *G01R 31/364* (2019.01); *G01R 31/385* (2019.01)

(58) Field of Classification Search
CPC . G01R 31/3648; G01R 31/385; G01R 31/364
See application file for complete search history.

(56) References Cited

U.S. PATENT DOCUMENTS

| | | | | |
|---|---|---|---|---|
| 5,528,148 A * | 6/1996 | Rogers | ............... | G01R 31/3832 324/426 |
| 6,055,169 A * | 4/2000 | Bowman | ........... | H02M 3/33561 363/71 |
| 8,134,340 B2 * | 3/2012 | Park | ........................ | H01M 4/44 320/136 |
| 2006/0091869 A1 * | 5/2006 | Zhang | .................... | H02M 3/156 323/282 |
| 2008/0224687 A1 * | 9/2008 | Breese | .............. | H01M 8/04634 324/76.11 |
| 2015/0048798 A1 * | 2/2015 | Godo | ..................... | B60L 58/22 320/134 |
| 2015/0362543 A1 * | 12/2015 | Gale | .................... | G01R 31/006 324/503 |

* cited by examiner

*Primary Examiner* — Robert H Kim
*Assistant Examiner* — Christopher J Gassen
(74) *Attorney, Agent, or Firm* — Quinn IP Law

(57) ABSTRACT

An active isolation detection method may be used with an electrical system having a battery pack connected to a high-voltage bus. The bus has positive and negative bus rails, each having a respective rail-to-ground voltage. The method may include connecting variable resistance element to the high-voltage bus, and determining input information indicative electrical characteristics of the battery pack, the high-voltage bus, and/or a charging station. The method includes varying a bias resistance of the high-voltage bus, via control of the variable resistance element, e.g., via duty cycle control of a binary switch in series with a bias resistor, to produce a varied bias resistance based on the input information. A target voltage shift is achieved on the high-voltage bus as a target level of change in one of the rail-to-ground voltages. An isolation resistance of the electrical system is determined via the controller using the varied bias resistance.

20 Claims, 10 Drawing Sheets

ACTIVE ISOLATION DETECTION USING ADAPTIVE BIAS RESISTANCE

INTRODUCTION

Electric powertrains of motor vehicles and other mobile platforms use one or more electric machines as propulsion motors or electric generators in different operating modes. High-voltage battery packs are typically used to energize the electric machine, with the term "high-voltage" typically being on the order of several hundred volts (V) or more, which is well in excess of typical 12-15V auxiliary/low-voltage levels. A battery management system or another battery controller may be used to efficiently manage powerflow to and from the individual cells of the battery pack.

Aboard a vehicle having a chassis, active isolation detection logic is used to ensure that the chassis ("chassis ground") remains electrically isolated from the high-voltage bus. In order to maintain proper electrical isolation, the isolation resistance of the positive and negative rails of the high-voltage bus may be calculated and compared to a threshold isolation resistance value. For this purpose, a binary switch may be commanded closed to selectively connect a bias resistor between the chassis ground and one of the bus rails. Connection of the bias resistor in this manner changes the rail-to-ground voltage by an amount referred to in the art and present application as the "voltage shift." The voltage shift is thereafter used to calculate the isolation resistance. However, existing methodologies for determining isolation resistance in a vehicle or other electrical system may be suboptimal, e.g., by insufficiently accommodating the range of possible battery pack configurations and/or infrastructure-based charging voltages that may be encountered.

SUMMARY

Disclosed herein are methods and systems for performing an active isolation detection function within an electrical system having a battery pack and a high-voltage bus. The present solution works by selectively adapting a bias resistance level responsive to electrical characteristics of the battery pack, the high-voltage bus, and/or charging equipment, e.g., an offboard charging station and onboard hardware. As will be appreciated by those of ordinary skill in the art, a battery pack may be recharged during operation, such as during a regeneration event when used aboard a motor vehicle, or using an offboard charging station when such a vehicle is turned off. A maximum charging voltage of the battery pack may also differ between offboard charging stations.

For instance, a battery pack used to energize an electric traction motor of a battery electric vehicle may use two parallel-connected ("P-connected") battery modules to provide a desired voltage capability, or the battery pack may use two series-connected ("S-connected") battery modules to double the voltage capability. Example configurations described herein for the purpose of illustrating the present method include a 400V P-connected battery pack and an 800V S-connected battery pack, without limiting applications to such voltage capabilities. Similarly, the present battery pack may be recharged via an offboard charging station having a maximum charging voltage that may equal to or exceed a voltage capability of the battery pack, for instance a 400V or 800V charging station when used with a 400V battery pack.

The possible disparity between the battery pack voltage and the charging voltage in either of the above-noted cases may render inadequate the use of a typical fixed bias resistor-based active isolation detection method. Likewise, a high-voltage system may have multiple different load configurations resulting in varying levels of baseline resistance. The present solution is therefore intended to address such potential problems, such as by enabling a lower-resistance bias resistor to functionally behave as a higher-resistance bias resistor, or by selectively connecting one or more elements to provide a variable bias resistance, referred to herein as a "variable resistance element".

In an exemplary non-limiting embodiment, a controller is used to adjust a duty cycle of a binary switch positioned in series with the above-noted bias resistor, e.g., using pulse width modulation ("PWM"), pulse density modulation ("PDM"), or another switching control signal. Other embodiments, as alluded to above, may selectively introduce other variable resistance elements to a similar effect, e.g., by connecting a combination of discrete resistances, a solid-state device operating in the linear mode, and/or a variable resistor.

In the various approaches, a bias current flowing through the bias resistor is adapted in real-time, e.g., using proportional-integral feedback control, in order to achieve a target voltage spread. Thereafter, the controller may execute or request execution of certain control actions with respect to the electrical system when an isolation resistance level calculated using such a voltage spread is less than a defined threshold.

A disclosed embodiment of the method determines isolation resistance of an electrical system having a battery pack connected to a high-voltage bus. The high-voltage bus has positive and negative bus rails each having a respective rail-to-ground voltage. The method in this embodiment includes connecting a variable resistance element on the high-voltage bus, and then determining input information via a controller. The input information is indicative of at least one electrical characteristic of the battery pack, the high-voltage bus, and/or a charging station. The method further includes varying a bias resistance of the high-voltage bus, via the variable resistance element, to thereby produce a varied bias resistance based on the input information, and to achieve a target voltage shift on the high-voltage bus. The target voltage shift is a target percentage or desired magnitude of change in one of the respective rail-to-ground voltages. Isolation resistance of the electrical system is then determined using the varied bias resistance.

In some embodiments, the variable resistance element is a binary switch, e.g., a semi-conductor switch, connected in series with a bias resistor. Varying the bias resistance in this embodiment includes selectively adjusting a duty cycle of the binary switch based on the input information.

The electrical characteristic(s) may include a voltage capability of the battery pack, a charging voltage present on the high-voltage bus, and/or a present charging or discharging operating mode of the battery pack, as well as ambient conditions such as humidity, temperature, etc. For instance, the battery pack and charging voltage may be 400V or 800V, or one may be 400V and the other 800V, using the non-limiting exemplary voltage levels described herein.

Prior to adjusting the duty cycle in the above-noted example embodiment that uses the binary switch and bias resistor, the method may include measuring a first voltage between the high-voltage bus and an electrical ground while the binary switch is in an open state, i.e., when the bias resistor is not connected to the high-voltage bus. After measuring the first voltage, a baseline switching control signal is applied to the binary switch, via the controller, as a function of the input information. A second voltage is thereafter measured between the voltage bus and the electrical ground.

The method in this particular embodiment may also include determining an actual voltage shift as a difference between the first and second voltages, and adjusting the baseline switching control signal in response to a threshold difference between the voltage shift and target voltage shift, with the adjustment producing an adjusted voltage shift. The adjusted voltage shift may be determined using a target effective bias resistance, i.e., an amount of bias resistance that would be needed in order to produce the adjusted voltage shift.

Adjusting the baseline switching control signal may include increasing or decreasing the duty cycle of the binary switch when the actual voltage shift is lower or higher in magnitude than the target voltage shift, respectively. A low signal-to-noise ratio ("SNR") may also be used to increase the duty signal. Adjusting the baseline switching control signal may be conducted by the controller in proportion to an amount by which the actual voltage shift differs from the target voltage shift, or an amount by which the SNR falls short of an SNR threshold.

The method may include executing a control action with respect to the electrical system, via the controller, when the isolation resistance is less than a threshold isolation resistance. The control action may include automatically disconnecting the battery pack from the high-voltage bus, turning off certain high-voltage functions, and/or displaying a warning message in various embodiments.

The electrical system of this method may be part of a vehicle having a chassis, in which case the electrical ground may be the chassis or "chassis-ground".

The method may optionally include adjusting the baseline switching control in response to a difference between a time rate of change of the voltage shift and a target rate of change of the voltage shift.

An electrical system is also disclosed herein that, according to an exemplary configuration, includes an electrical ground, a high-voltage bus having a bias resistor in electrical series with a switch, a battery pack connected to the high-voltage bus, voltage sensors connected to the high-voltage bus and configured to measure a voltage between the high-voltage bus and the electrical ground, and a controller in communication with the switch and the voltage sensors. The controller is configured to execute the above-noted method.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

Figure 1:
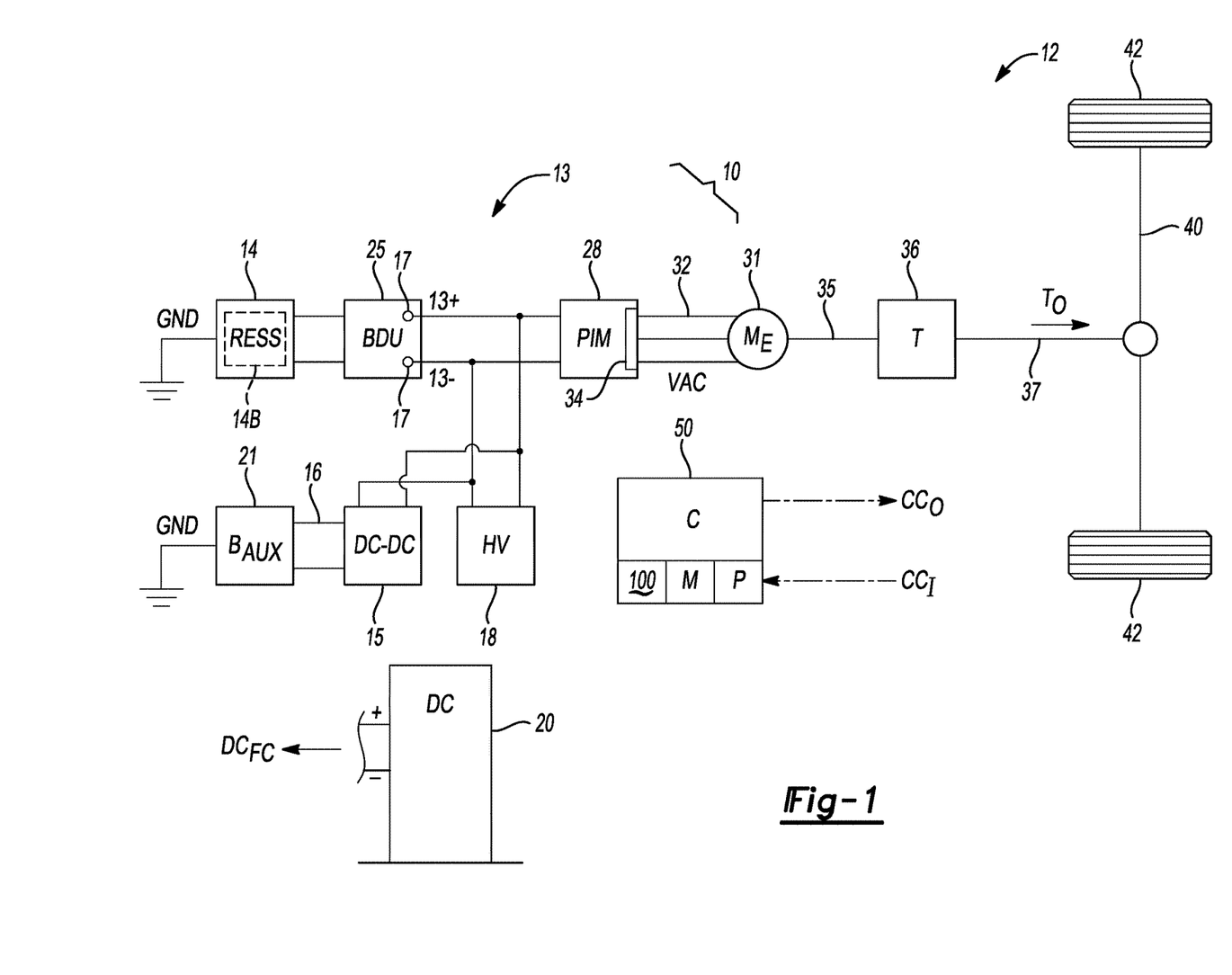
FIG. 1 is a schematic illustration of an example vehicle having an electrical system and a controller programmed to perform active isolation detection according to the present method.

Referring to the drawings, wherein like reference numbers refer to like components, an electrical system 10 is depicted schematically in FIG. 1. The electrical system 10 includes a high-voltage bus 13 and a rechargeable energy storage system ("RESS") 14. A direct current-to direct current ("DC-DC") converter 15 may be electrically connected to the high-voltage bus 13, and configured to output an auxiliary voltage on a low-voltage bus 16. An auxiliary battery ("$B_{AUX}$") 21 is possibly connected to the low-voltage bus 16 as shown. In some embodiments, the terms "high-voltage" and "low-voltage" may respectively encompass voltage levels of about 60 volts (V) or more and less than about 12-15V, with high-voltage levels possibly equaling or exceeding 400V or 800V in other embodiments. The RESS 14 includes a multi-cell rechargeable battery pack 14B having a lithium-ion, nickel metal hydride, or other application-suitable battery cell chemistry, as well as associated power electronics required for proper control and thermal regulation of such battery cells.

The electrical system 10 of FIG. 1 may be used as part of a motor vehicle 12 in a non-limiting example embodiment, or may be used as part of another type of vehicle, e.g., a rail vehicle, aircraft, watercraft, etc., or a power plant or other mobile or stationary system. For illustrative consistency, the motor vehicle 12 of FIG. 1 will be used herein without limitation as being representative of a type of system in which active isolation detection is used to ensure that a chassis/electrical ground ("GND") of the vehicle 12, referred to hereinafter as chassis-ground, remains electrically isolated from the high-voltage bus 13.

As will be explained in further detail below, active isolation detection is performed aboard the vehicle 12 via a controller (C) 50 using a variable resistance element 11, which in some embodiments includes a controllable switch S1 in series with a bias resistor $R_B$ (see FIG. 2). The controller 50 in such embodiments uses automatic high-speed switching control, e.g., pulse width modulation ("PWM"), pulse-density modulation ("PDM"), or other suitable high-speed switching control techniques, to allow a lower-resistance bias resistor to behave as a higher-resistance bias resistor using a method 100 as described below with reference to FIGS. 1A and 1B. In this manner, the controller 50 of FIG. 1 adapts a bias current flowing within the high-voltage bus 13 to the present charging mode or other electrical characteristic of the battery pack 14B and/or the high-voltage bus 13, using the variable resistance element 11, with the controller 50 doing so as part of a set of control signals (arrow $CC_O$) using feedback control. The controller 50 thereby optimizes the bias resistance of the electrical circuit 10.

In a non-limiting embodiment of the method 100, the controller 50 automatically changes a property of a variable resistance element 11, such as by connecting the bias resistor $R_B$ (see FIG. 2) to the high-voltage bus 13 via the control signals (arrow $CC_O$), and then periodically use one or more voltage sensors 17 to measure the voltage between a positive bus rail $13^+$ of the high-voltage bus 13 and the chassis-ground. The controller 50 may also separately measure the voltage between a negative bus rail $13^-$ of the high-voltage bus 13 and the chassis-ground.

As will be appreciated by those of ordinary skill in the art, the process of active isolation detection ordinarily involves examining the magnitude of a resulting voltage shift on the high-voltage bus 13 subsequent to introducing a predetermined fixed bias resistance, i.e., as the voltage level a given bus rails $13^+$ or $13^-$ drops and the voltage level on the other bus rail $13^+$ or $13^-$ rises. The amount of such a voltage shift is then used to calculate the effective isolation resistance, with higher voltage shifts corresponding to higher isolation resistances and vice versa. Existing active isolation detection approaches therefore look to the voltage shift, derive the effective isolation resistance using the present bias current and voltage shift, and thereafter compare the derived isolation resistance to a calibrated isolation resistance threshold to determine if sufficient high-voltage isolation is present.

The present method 100 operates in a different manner by adapting, in real-time, to electrical characteristics of the battery pack 14B, the high-voltage bus 13, and/or charging equipment, such as the DC fast-charging station 20, e.g., the available charging voltage, the voltage level of the RESS 14, and/or other factors as described below. It is recognized herein that a fixed bias resistance cannot properly accommodate the potentially wide range of charging infrastructure and vehicle-level voltages and isolation values presently in use. Thus, disclosed embodiments of the method 100 includes using the controller 50 and variable resistance element 11, e.g., the bias resistor $R_B$ and binary switch 11 connected in series, to adapt a bias current to an optimal mode-specific level, and to thereafter derive a target bias resistance for use in an active isolation detection methodology. The method 100 may also help diagnose certain fault conditions as described below.

The controller 50 shown schematically in FIG. 1 may be embodied as one or more low-voltage digital computers having a processor (P), e.g., a microprocessor or central processing unit, as well as memory (M) in the form of read only memory, random access memory, electrically-programmable read only memory, etc., a high-speed clock, analog-to-digital and digital-to-analog circuitry, input/output circuitry and devices, and appropriate signal conditioning and buffering circuitry. In some embodiments, the controller 50 may be a battery system manager, the functions of which may vary with the intended application, but possibly including monitoring and controlling temperature, state of charge, voltage, and other performance characteristics of the RESS 14.

Further with respect to the example motor vehicle 12 shown in FIG. 1, one or more high-voltage ("HV") components 18 may be electrically connected to the RESS 14 via the high-voltage bus 13. In turn, the RESS 14 may be electrically connected to the high-voltage bus 13 via a battery disconnect unit ("BDU") 25. Within the BDU 25 or another suitable location on the high-voltage bus 13, the voltage sensors 17 are used to measure and report the voltage between chassis ground and a respective one of the positive and negative bus rails $13^+$ and $13^-$, or other suitable voltages used to calculate isolation resistance.

Although omitted for simplicity from FIG. 1, the BDU 25 also includes high-voltage switching devices such as solenoid-driven contactors, solid-state/semiconductor switches, and/or other suitable switching devices, a pre-charge resistor, and other components for electrically connecting the RESS 14 to the remainder of the electrical system 10. Responsive to the input signals (arrow $CC_I$), the controller 50 generates and outputs the control signals (arrow $CC_O$) to the electrical system 10 to ultimately change a logic and/or operating state/dynamical state of the electrical system 10, such as by changing an on/off state of a switch as set forth below, commanding operation of the BDU 25 to connect or disconnect the BDU 25, and/or commence a charging operation of the RESS 14 via a DC fast-charging voltage (arrow $DC_{FC}$) via an offboard DC fast-charging station 20.

Additionally, the electrical system 10 may optionally include a power inverter module ("PIM") 28 that is electrically connected to a polyphase electric machine ($M_E$) 31, e.g., an electric traction motor as shown or an electric generator in other embodiments, via an alternating current ("VAC") voltage bus 32. When energized, the electric machine 31 outputs motor torque to drive an input member 35 of a coupled driven load, e.g., transmission ("T") 36. Output torque (arrow $T_O$) is then transmitted from an output shaft 37 of the transmission 36 to one or more drive axles 40, and ultimately to a set of road wheels 42 in the illustrated motor vehicle 12.

As will be appreciated by those of ordinary skill in the art, the PIM 28 includes semiconductor switches 34, e.g., a bank of IGBTs, MOSFETs, or other application-suitable switches shown collectively and schematically in FIG. 1 for simplicity. The semiconductor switches 34 have a corresponding on/off (conducting/non-conducting) switching states that may be controlled responsive to PWM switching signals from the controller 50, as part of the control signals (arrow $CC_O$). The PWM switching control signals may be used for power inversion or conversion as needed, as will be appreciated by those of ordinary skill in the art.

Figure 1A:
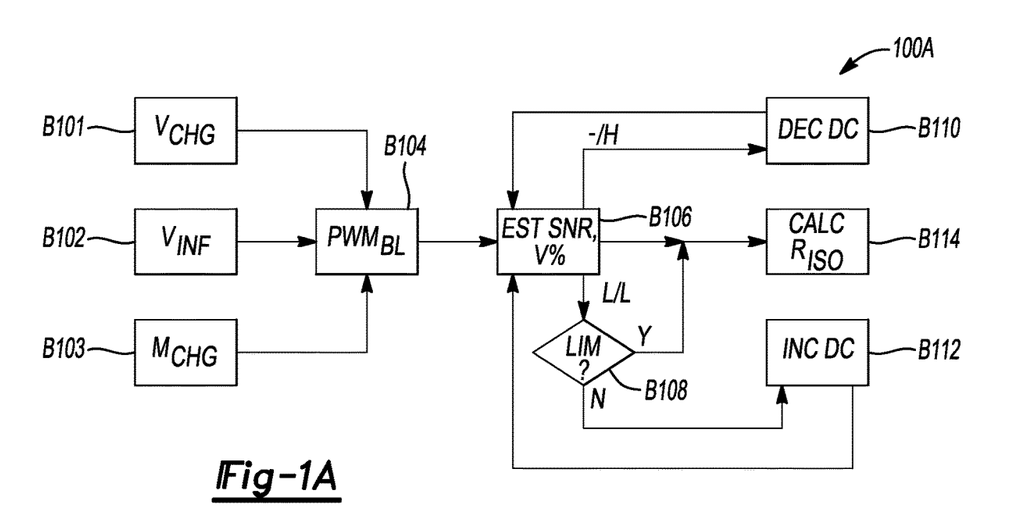
FIGS. 1A and 1B are flow charts describing an exemplary method according to the present disclosure.
Figure 2:
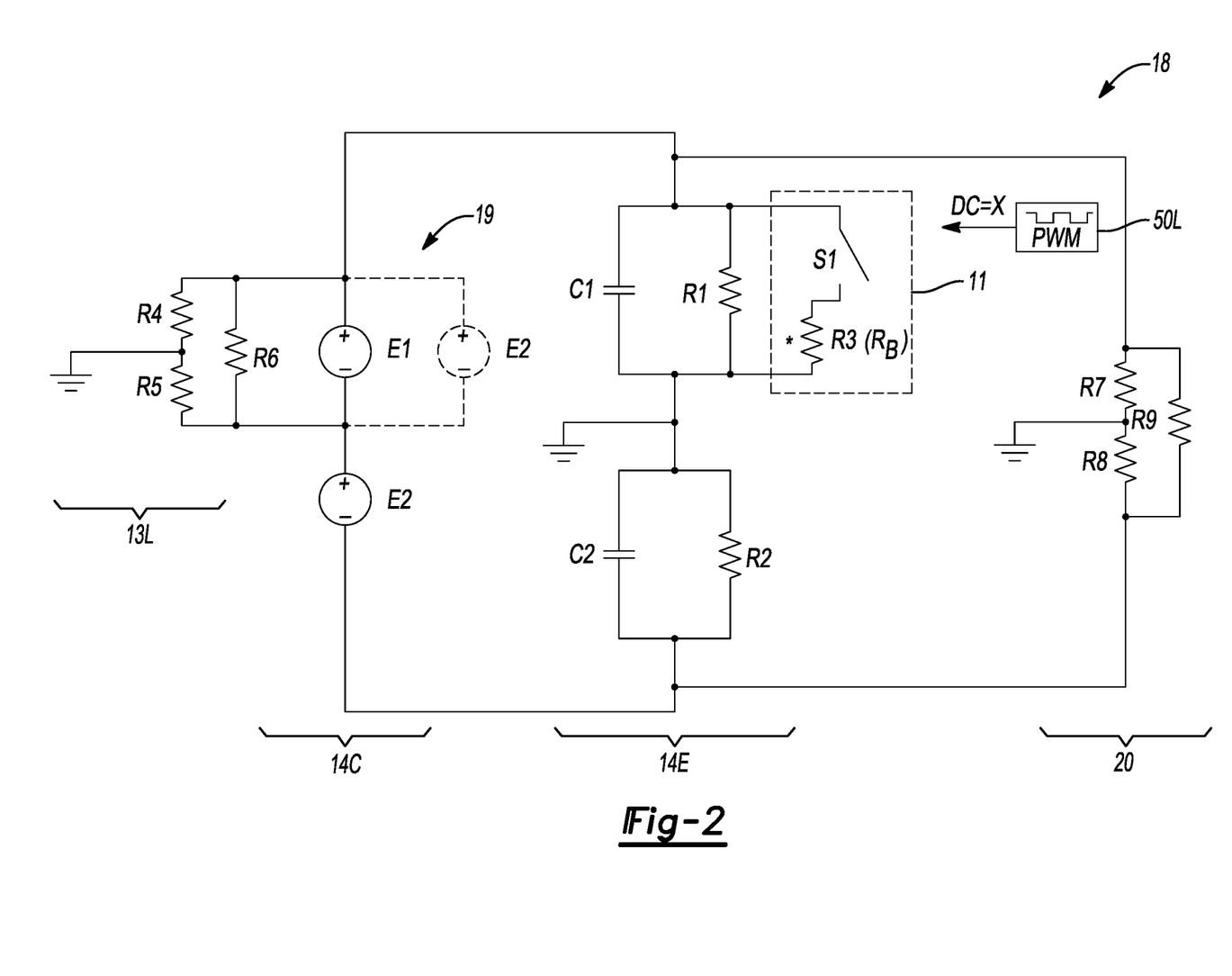
FIG. 2 is a schematic illustration of an equivalent circuit for a portion of the electrical system depicted in FIG. 1.
Figure 6:
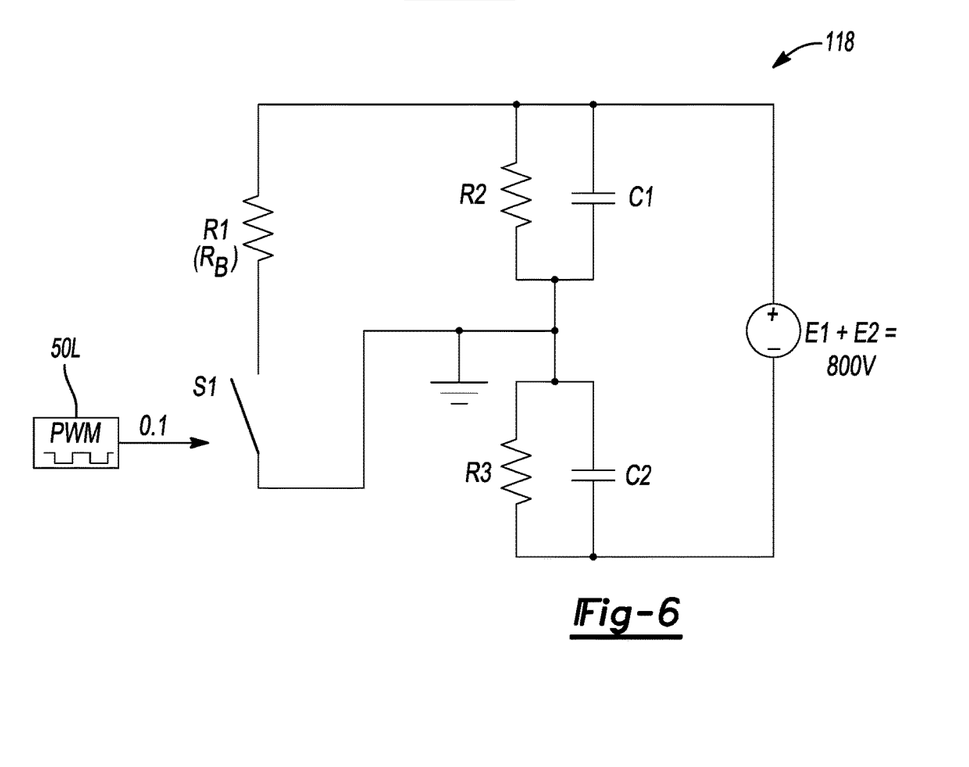
FIG. 6 is a schematic illustration of an equivalent circuit for an alternative non-optimized charging configuration.
Figure 8:
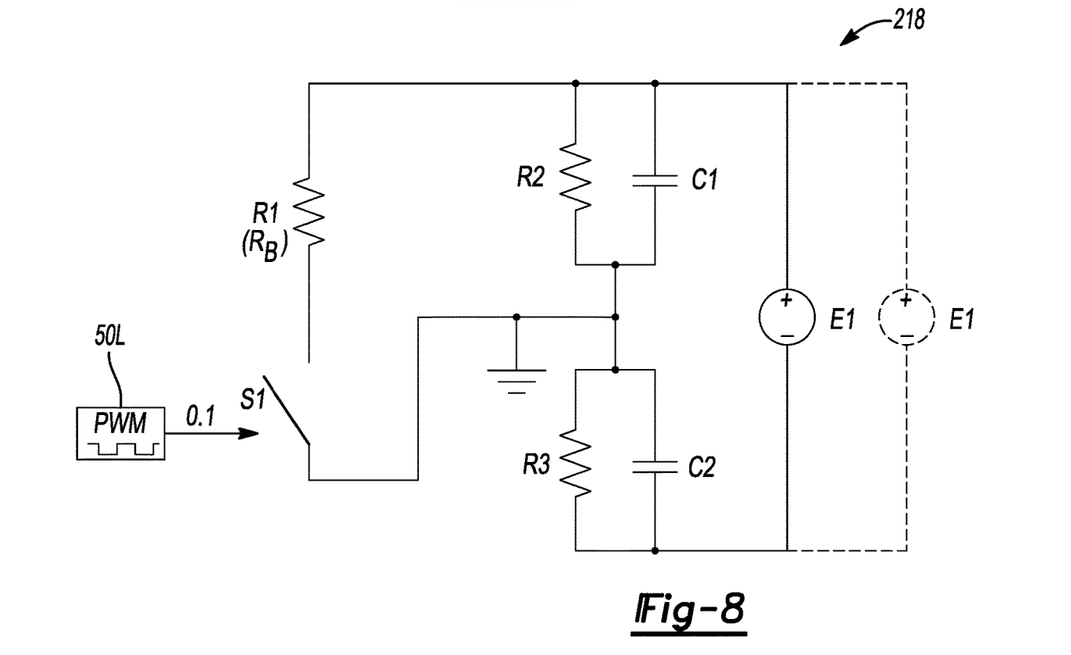
FIG. 8 is a schematic illustration of an equivalent circuit for an alternative non-optimized charging configuration.

FIG. 1A depicts, via reference number 100A, a high-level exemplary embodiment of the method 100 in which duty cycle variation of the binary switch S1 of FIGS. 2, 6, and 8 is used to vary the effective bias resistance of the electrical system_10 in order to produce a particular voltage shift in the course of an active isolation detection scheme. In the non-limiting duty cycle variation embodiment depicted in FIG. 1A, a target effective bias resistance that is needed to produce a predetermined voltage shift is implemented by modifying the duty cycle of the binary switch S1. However, as noted above other embodiments of the variable resistance element 11 may replace the series-connected bias resistor $R_B$ and duty cycle-controlled binary switch S1 with other types of variable resistance elements, e.g., hardware elements having a variable property, to the produce the same effect, such as by using combinations of discrete resistances, controlling the resistance level of a variable resistor, and/or linear mode operation of a solid-state switch, and therefore the described duty cycle variation is just one possible implementation of the present teachings.

Beginning with blocks B101, B102, and B103, which collectively determine input information indicative of the above-noted electrical characteristic(s) of the battery pack 14B, high-voltage bus 13, and/or the DC fast-charging station 20 of FIG. 1 or other charging equipment, the controller 50 of FIG. 1 may determine at block B101 present charging conditions ("$V_{CHG}$") of the motor vehicle 12. In a charging scenario, for instance, i.e., when the vehicle 12 is connected to the offboard DC fast-charging station 20, the controller 50 determines the available charging voltage, e.g., via communication with the DC fast-charging station 20. Non-limiting illustrative example charging voltages used herein include 400V and 800V.

Block B102 may include determining vehicle information ("$V_{INF}$"). For example, the vehicle information may include the charging voltage from the charging station 20 of FIG. 1, voltage capability of the RESS 14, other parameters of the charging station 20 and/or the RESS 14 such as impedance, age, temperature, state of health, etc., humidity, geographical location of the vehicle 12, etc.

Block B103 may include determining the charging mode ("McHG"), e.g., whether the vehicle 12 is actively charging or discharging, as well as the charging standard being utilized, e.g., CHAdeMO, J1772, GB/T 20234, etc. The method 100A proceeds to block B104 once the input information from blocks B101, B102, and B103 has been determined.

At block B104, the controller 50 applies a baseline switching control duty cycle ("$PWM_{BL}$") to a binary switch S1 as shown in FIG. 2 and described below, e.g., a semiconductor switch such as an IGBT or MOSFET, to thereby introduce a baseline bias resistance into the electrical circuit 10 of FIG. 1. While PWM is used as an exemplary switching control method, other techniques may be used to change the bias resistance, including other switching control methods like pulse density modulation ("PDM"). The method 100A then proceeds to block B106.

Block B106 entails estimating a signal-to-noise ratio and a voltage shift amount or percentage ("EST SNR, V %") via the controller 50 once the baseline bias resistance has been introduced. As part of block B106, the controller 50 may compare the signal-to-noise ratio ("SNR") and voltage shift amount/percentage ("V %") to corresponding threshold ranges. The actual limits used in block B106 are application-specific and mode-specific. For instance, a voltage shift range of 30-50V may be used for an exemplary 800V charging operation, or a defined limit of 40V in an illustrative example in the motor vehicle 12 of FIG. 1 may be based on equivalent isolation resistance limits. Another possible approach is to look for a voltage shift of at least 20%, i.e., a 20% or greater change in voltage measured between the positive rail 13+ (or negative rail 13−) and chassis-ground before and after introducing a bias resistance current through the bias resistor $R_B$.

If the voltage shift or an SNR value is lower than a corresponding threshold value or range ("L/L"), then the method 100A proceeds to block B108. However, if the voltage shift amount/percentage is higher than its threshold range ("−/H"), the method 100A proceeds instead to B110. The method 100A proceeds directly to block B114 when either/both of the voltage shift amount/percentage and the SNR values are acceptable relative to their respective ranges.

At block B108, the controller 50 next compares the equivalent isolation resistance to a predetermined limit ("LIM"). If the voltage shift is at or above such a limit, the method 100A proceeds to block B114. The method 100A otherwise proceeds to block B112.

Block B110 includes decreasing the present duty cycle ("DEC DC") to the switch S1 of FIG. 2 and then returning to block B106. For instance, adjustment of the duty cycle may be in proportion to the amount by which the voltage shift percentage exceeds its threshold in block B106. Block B110 has the effect of changing the effective bias resistance of the electrical system 10, with the amount of adjustment therefore informed by a target bias resistance the controller 50 is seeking to establish. That is, the controller 50 determines the bias resistance that would be needed in order to produce a desired voltage shift, with the magnitude of the duty cycle adjustment in block B110, or the selection of circuit element combinations in alternative hardware-implemented embodiments, thus informed by such a consideration.

Block B112, analogously to block B110, includes increasing the present duty cycle ("INC DC") to the binary switch S1 of FIG. 2, e.g., in proportion to the amount which the SNR value or the voltage shift falls below its assigned limit in block B108, and then returning to block B106. As with block B110, the controller 50 determines the bias resistance needed in order to produce a desired voltage shift, with the magnitude of the duty cycle adjustment in block B112 informed by this consideration.

At block B114, the controller 50 calculates the isolation resistance ("CALC $R_{ISO}$") as a function of the voltage shift range from block B106. That is, knowing the voltage shift and the biasing current to the biasing resistor $R_B$, the controller 50 is able to derive the isolation resistance, and to thereafter use the isolation resistance to execute control actions as needed, including recording a diagnostic code indicative of the isolation resistance.

The method 100 thus enables the controller 50 to determine an actual voltage shift as a difference between a first voltage, measured with the binary switch S1 open, and a second voltage measured when applying PWM or other switching control signals, and adjusting a baseline switching control signal in response to a threshold difference between the actual voltage shift and a target voltage shift. In this manner, the controller 50 produces an adjusted voltage shift, with the adjusted voltage shift thereafter used to determine a target bias resistance. Adjusting the baseline switching control signal may include increasing or decreasing the duty cycle as shown in blocks B112 and B110, respectively, which occurs when the actual voltage shift is lower or higher than the target voltage shift, respectively, or when the SNR value is too low, as noted above.

Figure 1B:
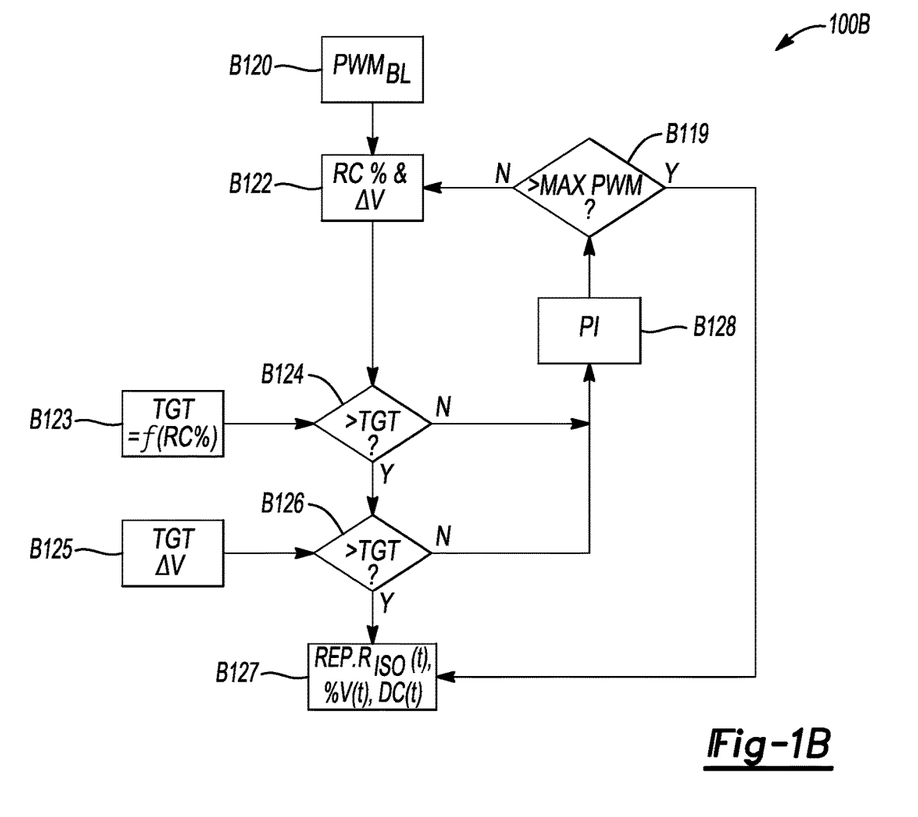

FIG. 1B depicts, via reference number 100B, a particular embodiment of the method 100 that utilizes voltage differential (dV/dt)-based proportional-integral feedback control of the PWM duty cycle. The method 100B may begin with block B119, with the controller 50 of FIG. 1 determining whether the current duty cycle is at a maximum (">MAX PWM"). If the current duty cycle is not at its maximum, the method 100B continues to block B122, with the controller 50 otherwise proceeding to block B127.

At block B120, the controller 50 applies a baseline PWM duty cycle ("$PWM_{BL}$") to the binary switch S1 of FIG. 2 in order to introduce a baseline bias resistance. Block B120 is thus the same as block B104 described above with reference to FIG. 1A. The method 100B then proceeds to block B122.

Block B122 includes calculating the differential voltage, i.e., "ΔV", and dV/dt response as a percentage, i.e., "RC %". As will be appreciated by one of ordinary skill in the art, electrical components connected to the RESS 14 of FIG. 1 collectively exhibit a capacitance and a resistance that together give rise to an RC time response or decay rate. The controller 50 is thus configured to use the demonstrated RC response within the context of the method 100B to perform active isolation detection in the electrical circuit 10 of FIG. 1. The method 100B proceeds to block B124 once the differential voltage and dV/dt have been calculated.

At block B123, the controller 50 next calculates a target dV/dt as a function of the RC response of the electrical circuit 10, i.e., "TGT=ƒ(RC %)", with the method 100B then using this target value at block B124.

Block B124 includes comparing the RC response from block B122 to the corresponding target from block B123 to determine by how much the dV/dt from block B122 exceeds its target, i.e., ">TGT". The method 100B proceed to block B126 when the dV/dt value from block B122 exceeds its target, and to block B128 in the alternative when the RC response from block B122 does not exceed its target.

At block B125, the controller 50 calculates a target voltage shift ("TGT ΔV"). Block B125 may entail selecting a calibrated or predetermined voltage shift value from a lookup table or calculating another value, e.g., a percentage of the voltage capacity of the RESS 14 or the HV bus voltage. The controller 50 then uses this target value at block B126.

Block B126, which is analogous to block B124, includes comparing the voltage shift from block B122 to the corresponding target voltage shift from block B125 to determine whether the value from block B122 exceeds the target, i.e., ">TGT". The method 100B proceeds to block B127 when the value from block B122 exceeds the target from block B125, and otherwise proceeds to block B128.

Block B127 includes calculating the isolation resistance (block B114 of FIG. 1A) and reporting this value and the RC response values, i.e., "REP. $R_{ISO}(t)$, % V(t), DC(t)". The act of "reporting" may entail recording the indicated values in memory (M) for use by the controller 50 and/or another control unit in executing certain control actions responsive to the recorded or reported values, e.g., disconnecting the RESS 14 when the isolation resistance is insufficient, activating an alert, etc.

At block B128, the controller 50 executes proportional-integral ("PI")-based feedback control over the PWM function to modify the duty cycle of the switch S1 (FIG. 2). The method 100B then returns to block B119.

FIG. 2 is an equivalent RC circuit 18 for key portions of the electrical system 10 shown in FIG. 1. Shown left-to-right in FIG. 2 are HV bus loads 13L, battery cells 14C of the RESS 14, battery electronics 14E of the RESS 14, and the offboard DC fast-charging station 20. In the example configuration, two 400V battery modules (E1 and E2) are shown connected in series ("S-connected") to form an 800V battery pack, with the HV bus loads 13L connected to one half of such a battery pack. The series-connected battery modules (E1 and E2) are charged via an 800V embodiment of the DC charging station 20. As shown at 19, another possible configuration is that of two 400V battery modules (E1 and E2) connected in parallel ("P-connected") as a 400V battery pack, which is charged via a 400V embodiment of the DC charging station 20. Thus, the particular configuration of the battery modules (E1 and E2) and the maximum charging voltage of the DC charging station 20 are considered by the controller 50 in the course of performing the method 100.

Switching control logic 50L of the controller 50 is used to selectively modify the PWM duty cycle ("DC=X") to the above-noted switch S1, and to thereby change the open/closed state of the switch S1. Shown schematically for simplicity, the binary switch S1 may be variously embodied as a semi-conductor switch, e.g., an IGBT, MOSFET, etc., or another application-suitable high-speed switch configuration. The equivalent RC circuit 18 as shown has a total of nine resistors (nominally numbered R1-R9 for clarity) and two capacitors (C1 and C2). Resistor R3 acts as the bias resistor ($R_B$) in the depicted circuit, with the bias resistor ($R_B$) having an on/off state that is regulated in real-time via the switching control logic 50L.

An example 800V charging configuration using the series-connected battery modules (E1 and E2) of FIG. 2 may assume station isolation resistance of 1500 kΩ, i.e., the resistance of the DC fast-charging station 20 shown in FIG. 1. Resistors R7 and R8 are 1500 kΩ, therefore, with the resistor R9 being low, e.g., 160Ω. Additionally, the HV bus loads 13L, i.e., resistors R4, R5, and R6, may be 1000 kΩ, 1000 kΩ, and 160Ω, respectively. The battery electronics 14E may represented as resistors R1 and R2, each of 6MΩ in this embodiment. The bias resistor ($R_B$), i.e., resistor R3, is 500 kΩ in this embodiment. The capacitors C1 and C2 may each represent a capacitance of 1 μF in this illustrative example. In the alternative parallel configuration of the battery modules (E1 and E2), the resistors R7 and R8 may be 500 kΩ.

Figure 3:
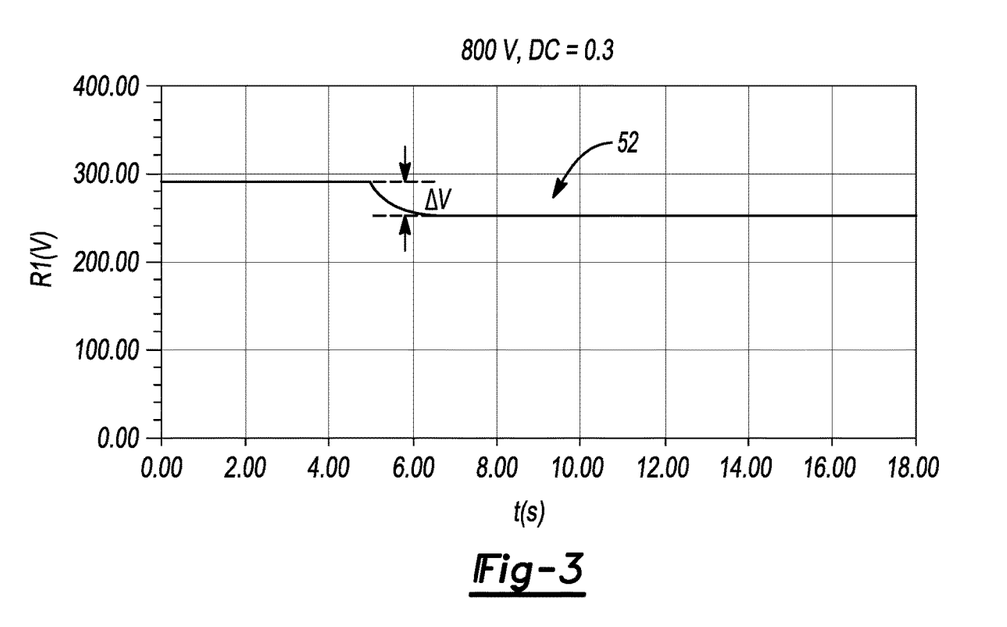
FIGS. 3-5 are plots of voltage (vertical axis) versus time (horizontal axis) after switch-in of a bias resistor into the exemplary circuit of FIG. 2 for different charging voltages, charging station isolation resistance values, and duty cycles.
Figure 4:
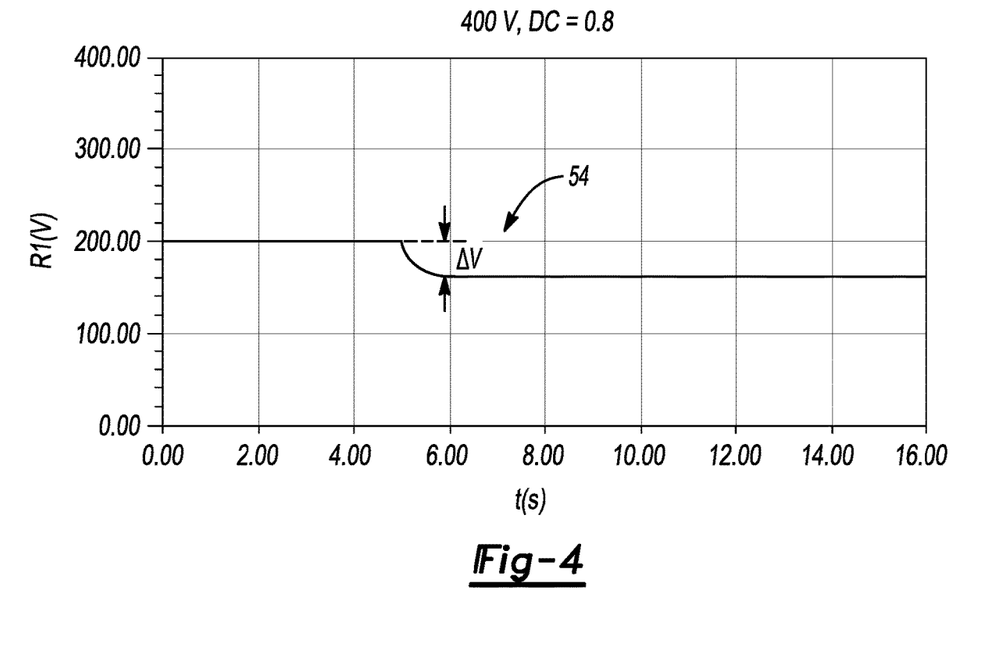

Referring to FIGS. 3 and 4, the equivalent RC circuit 18 of FIG. 2 may be in respective 800V and 400V charging configurations, e.g., with 1500 kΩ and 500 kΩ station isolation resistances (R7 and R8), respectively. The different charging configurations may be optimized at different duty cycles to reach a desired voltage shift (ΔV) by a certain elapsed time, for instance 6 seconds.

Figure 5:
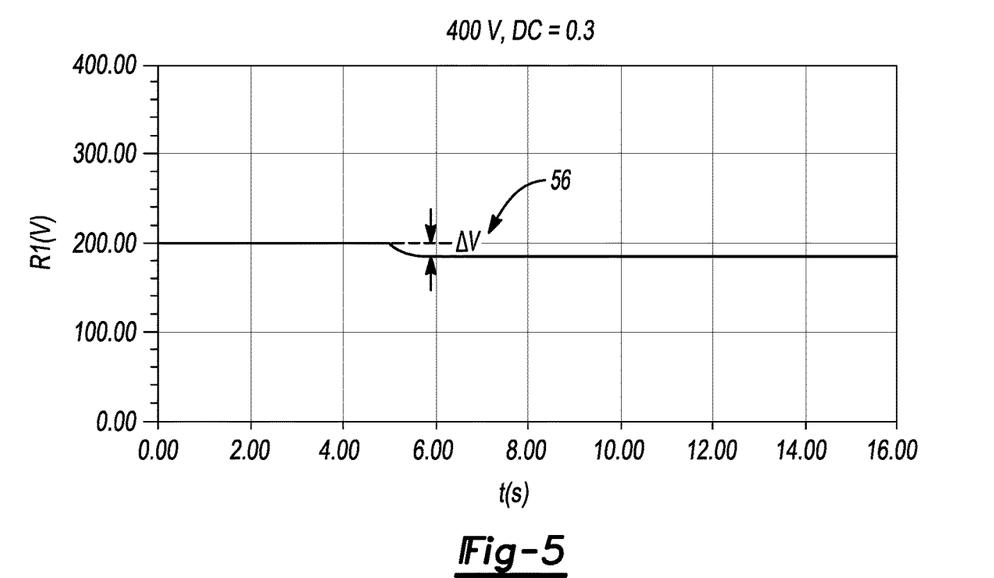

FIG. 3 depicts trace 52 as an optimized response at a duty cycle of 30 percent ("800V, DC=0.3") for PWM control of the switch S1 in the 800V charging configuration. In comparison, FIG. 4 depicts trace 54 as an optimized response at a duty cycle of 80 percent ("400V, DC=0.8") for the 400V charging configuration. Here, a representative voltage shift (ΔV) of about 40V may be considered indicative of an optimized isolation response, with the actual voltage shift amount possibly being different for other voltages and/or applications. By way of contrast with FIG. 5, trace 56 of FIG. 5 shows a suboptimal response being at a duty cycle of 30 percent ("400V, DC=0.3") if one were to use the 30 percent duty cycle deemed optimal for the 800V charging configuration. Thus, the series or parallel configuration of the battery modules (E1 and E2) and charging voltage are used to inform the switching control logic 50L of FIG. 2 when selecting the optimal duty cycle when the controller 50 performs active isolation detection.

Figure 7:
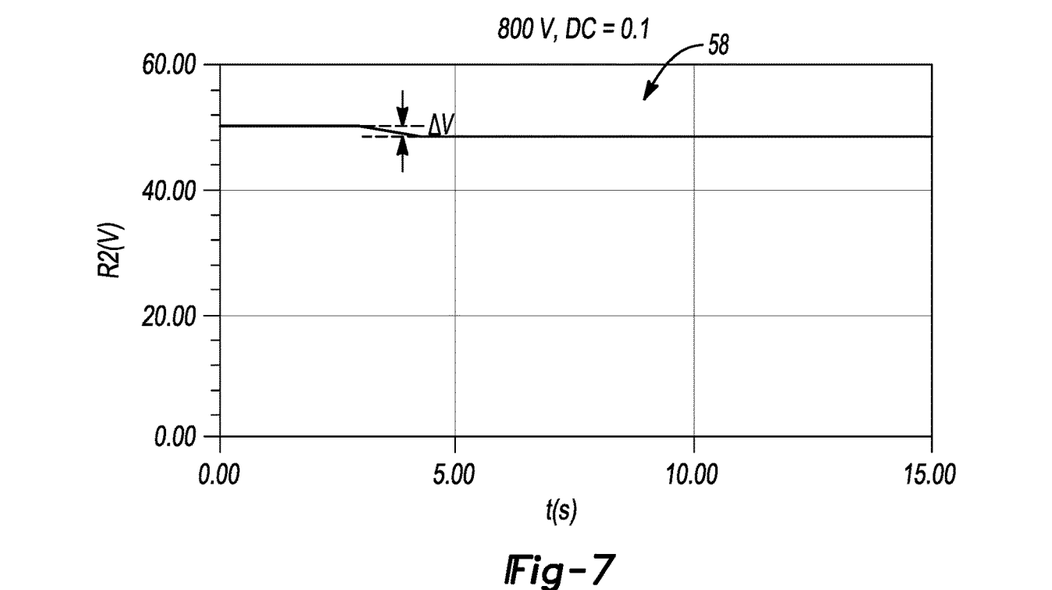
FIG. 7 is a plot of voltage (vertical axis) versus time (horizontal axis) after switch-in of a bias resistor into the exemplary circuit of FIG. 6.

FIGS. 6 and 7 respectively represent another equivalent RC circuit 118 (FIG. 6) with a total voltage of 800V on the HV electrical bus 13 of FIG. 1, and the optimized response (FIG. 7) for such an 800V configuration. To achieve the 800V bus voltage, for instance, the example battery modules E1 and E2 each at 400V may be connected in series as shown in FIG. 2. In FIG. 6, the resistors R3, R2, and R1 are 6MΩ, 400 kΩ, and 1MΩ, respectively. The capacitors C1 and C2 remain 1 μF. The switching control logic 50L thus controls a switch S1, here with an example duty cycle of 10% (0.1), and the resistor R1 acts as the biasing resistor ($R_B$). FIG. 7 depicts trace 58 as the response with a duty cycle of 10 percent, i.e., "800V, DC=0.1"), to achieve the predetermined voltage shift (ΔV) and thus ultimately determine the present isolation resistance.

Figure 9:
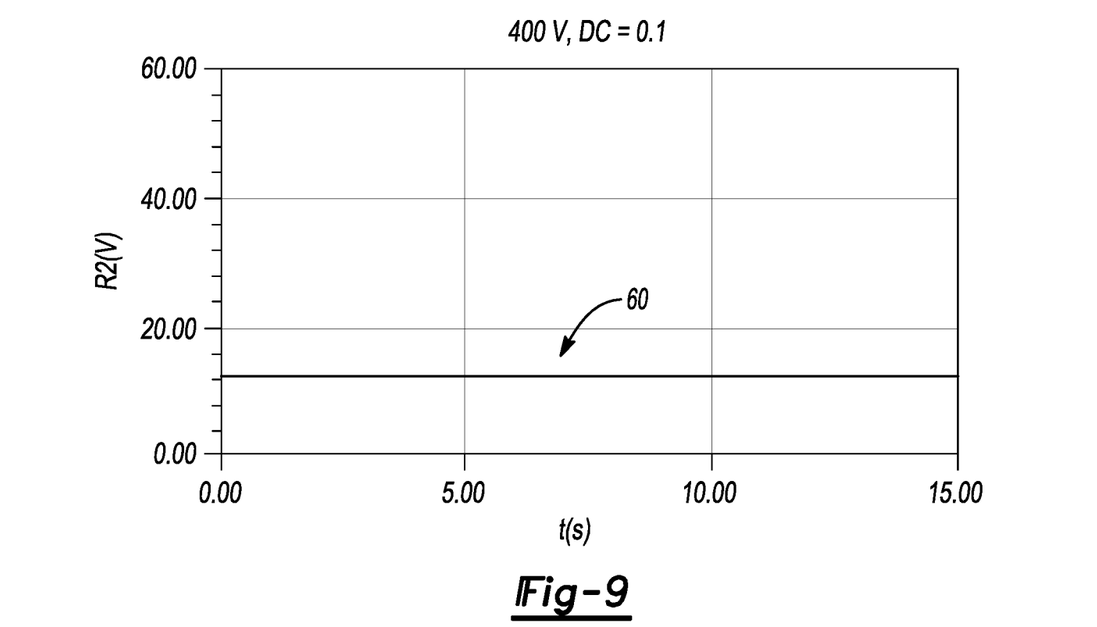
FIGS. 9-17 are plots of voltage (vertical axis) versus time (horizontal axis) after switch-in of a bias resistor into one of the exemplary circuits of FIG. 6 or FIG. 8.

FIGS. 8 and 9 represent yet another equivalent RC circuit 218 (FIG. 8) and non-optimized response (FIG. 9) for the above-noted 400V configuration, i.e., battery modules E1 and E2 both have a voltage capability of 400V and are connected in parallel. In FIG. 8, resistor R3 is 6MΩ, R2 is 200 kΩ (half of the value of FIG. 6), and R1 is 1MΩ, with capacitors C1 and C2 remaining 1 µF. In the illustrated RC circuit 218, the switching control logic 50L controls switch S1, and the resistor R1 continues to act as the biasing resistor ($R_B$). FIG. 9 depicts a suboptimal result in the event the duty cycle remained 10%. That is, the resulting voltage shift in the example 400V configuration of FIG. 8 is negligible, as indicated by trace 60, and thus the isolation resistance does not change. Such a response indicates that the chosen duty cycle of 10% ("400V, DC=0.1") is too low. As depicted in FIG. 1A, then, block B112 would respond to this condition by increasing the duty cycle via the PWM logic 50L.

Figure 10:
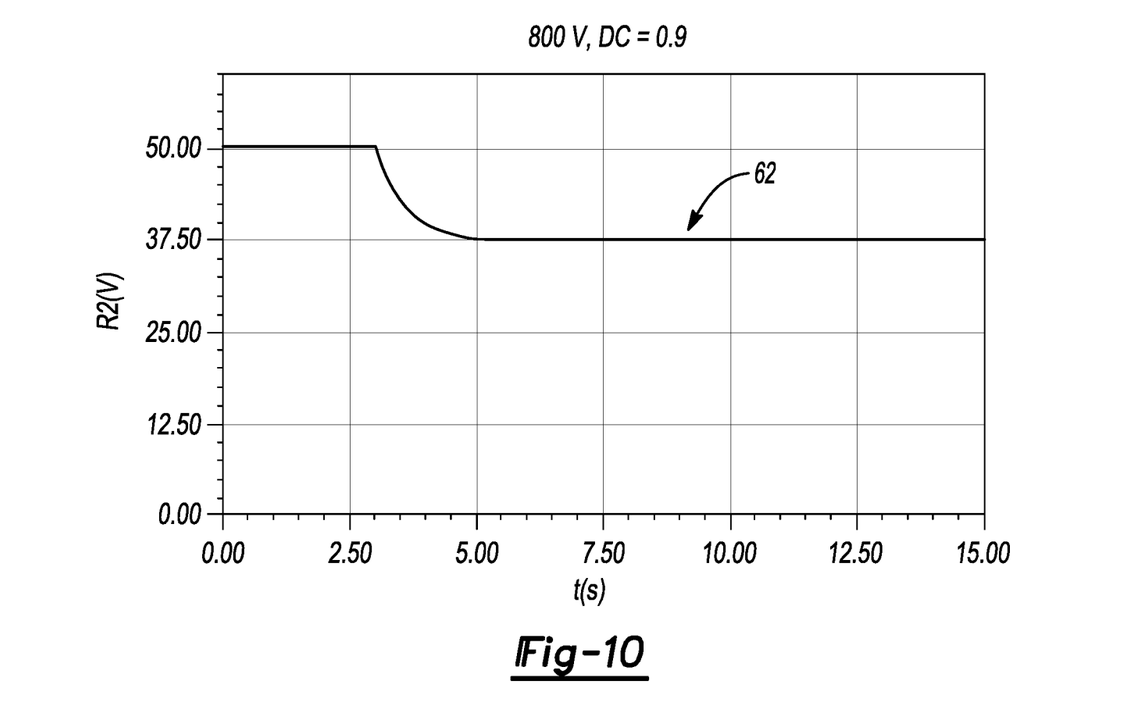
Figure 11:
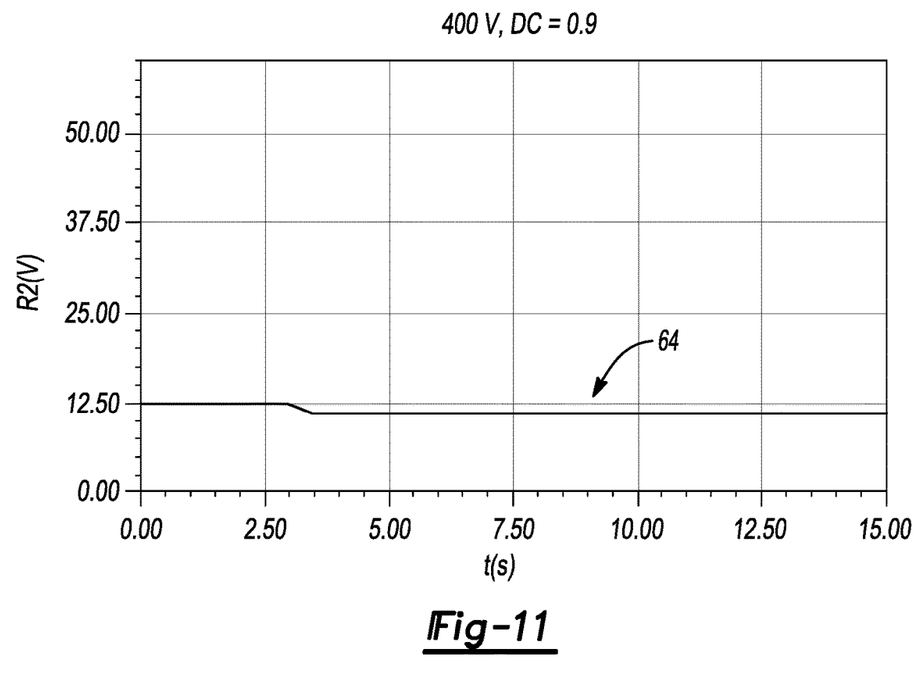

FIGS. 10-17 depict various possible optimal and suboptimal responses to further illustrate the present teachings. For instance, with a threshold isolation resistance of 400 kΩ in an 800V configuration of the RESS 14, e.g., series battery modules, the illustrated isolation response of FIG. 10 shows as trace 62 the isolation response to an exemplary duty cycle of 90 percent ("800V, DC=0.9"), with the duty cycle being too high in this instance. That is, the voltage across resistor R2 drops from 50V to 37.5V, corresponding to a decrease in isolation resistance in this example case from 400 kΩ to 277 kΩ, such that 69% isolation remains. The controller 50 would, in such a case, reduce the duty cycle at block B110 of FIG. 1A to increase the resulting isolation resistance to more closely approach a calibrated target. By comparison, FIG. 11 (optimal) depicts as trace 64 an example response to the same 90 percent duty cycle in the 400V charging configuration ("400V, DC=0.9"). In such a case, 82 percent isolation remains, which may more closely approach a desired target. Once again, the same duty cycle, when applied to different configurations of the RESS 14, produces a different voltage isolation result. The duty cycle may therefore be tuned to the particular RESS 14 and/or charging station 20.

Figure 12:
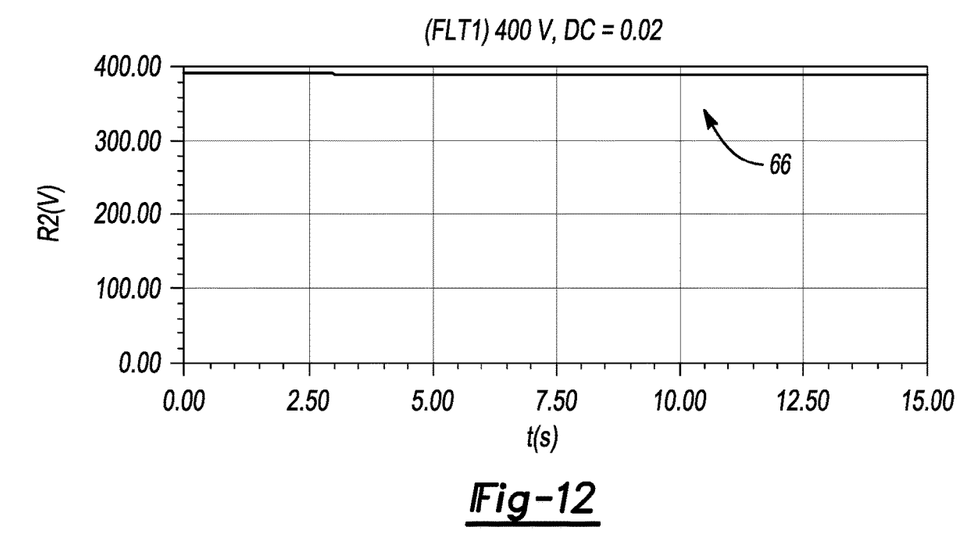
Figure 13:
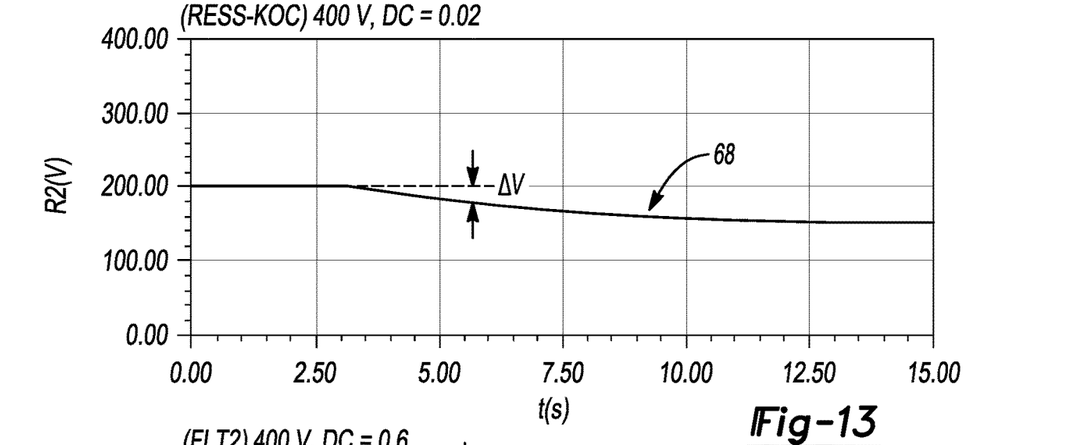

FIGS. 12 and 13, i.e., traces 66 and 68, respectively, contrast a severe isolation failure ("FLT1", "400V, DC=0.02") in FIG. 12 with normal key-off operation of the RESS 14 ("RESS-KOC", "400V, DC=0.02") in FIG. 13 during 400V operation of the RESS 14, and using a low PWM duty cycle of 2 percent. Here, resistors R1, R2, and R3, of FIG. 8, are 200 kΩ, 1500 kΩ, and 40 kΩ, respectively. The response of FIG. 12 (trace 66) may be indicative of unacceptably poor voltage isolation, e.g., a single-side fault. However, FIG. 13 (trace 68) using the same duty cycle of 2 percent during a key-off check of the RESS 14 indicates an optimal response. Here, resistors R1, R2, and R3 are 200 kΩ, 6MΩ, and 6MΩ, respectively.

Figure 14:
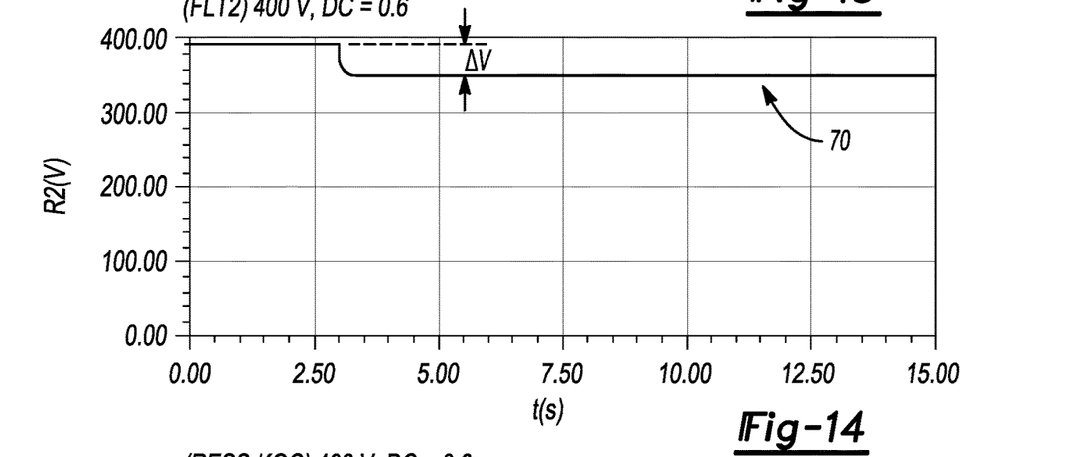
Figure 15:
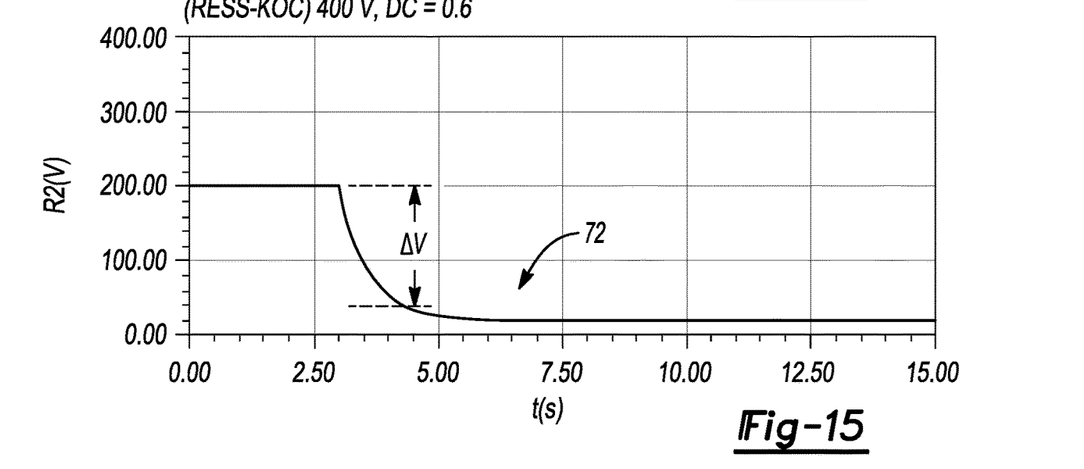

FIGS. 14 and 15 depict another example, this time with a PWM duty cycle of 60 percent. Trace 70 of FIG. 14 represents another severe failure, i.e., an imbalanced fault ("FLT2", "400V, DCV=0.6"). Resistors R1, R2, and R3, of FIG. 8, are 200 kΩ, 1500 kΩ, and 40 kΩ, respectively. In the response of trace 70, the voltage spread (ΔV) is indicative of good isolation, e.g., about 40-50V in this instance. The response of trace 72 of FIG. 15, again during a key-off state of the RESS 14 ("RESS-KOC", "400V, DC=0.6"), shows a voltage spread of about 180V, which is substantially all of the initial voltage shift range, itself indicative of an excessively high PWM duty cycle. The controller 50 may respond to such an aggressive response at block B110 of FIG. 1A by reducing the PWM duty cycle as explained above.

Figure 16:
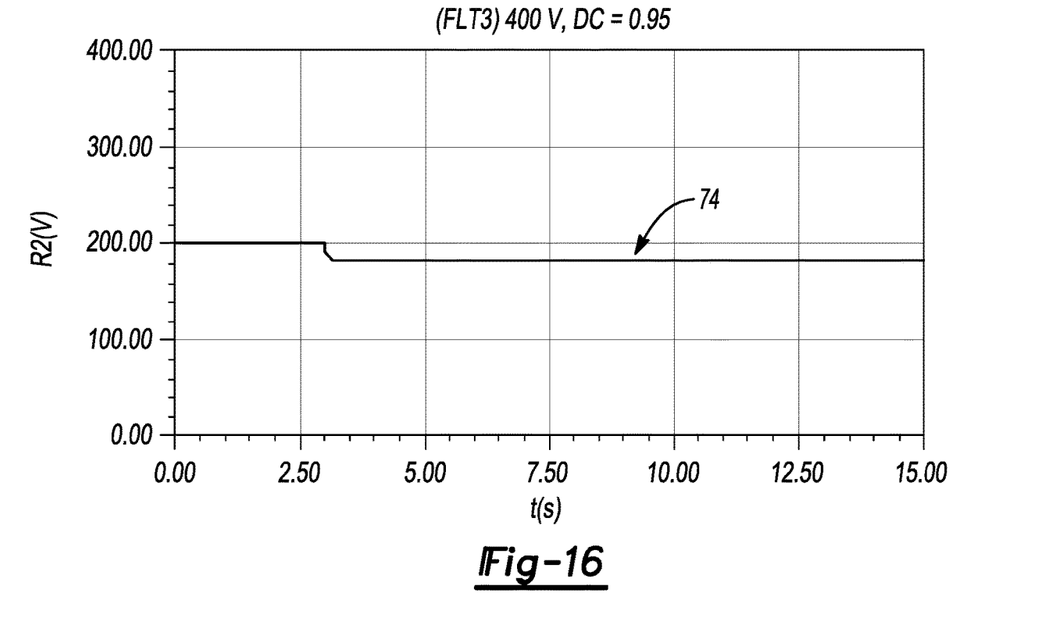

Another illustrative example scenario is depicted in FIG. 16 for another severe isolation failure detection at a duty cycle of 95 percent ("FLT3", "400V, DC=0.95"). The values of resistances R1, R2, and R3 (see FIG. 8) in this instance are 200 kΩ, 40 kΩ, and 40 kΩ, respectively. The low isolation resistance of R2 is indicated by the trajectory of trace 74, i.e., the voltage across R2. If a voltage spread (ΔV) of 40V is the expected response for performing isolation resistance calculations, for instance, the response of FIG. 16, i.e., ΔV=20V, may be indicative of a balanced fault condition.

Figure 17:
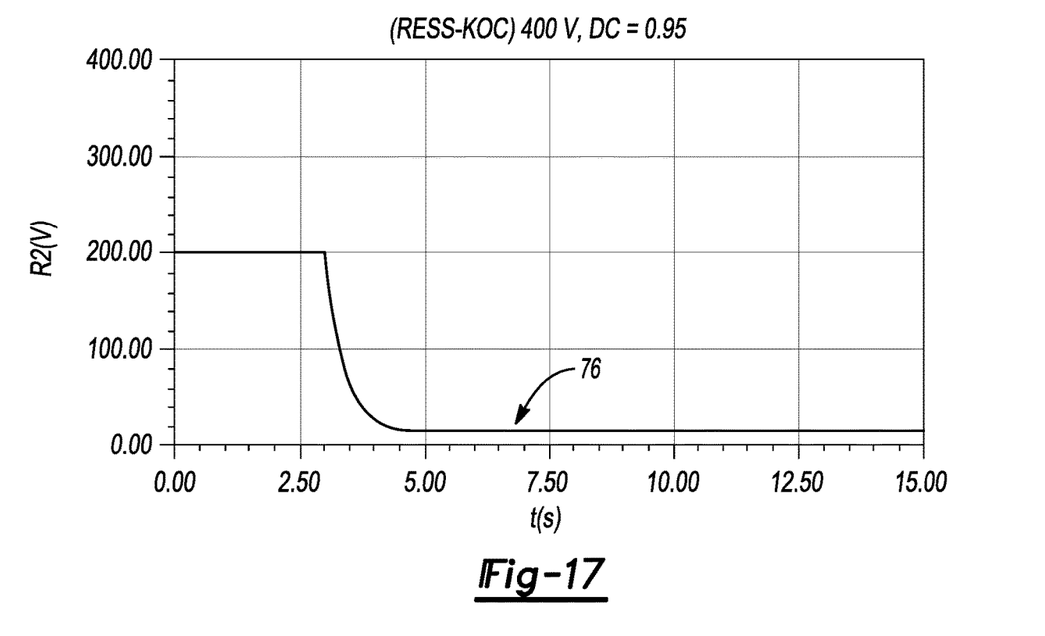

Referring to FIG. 17, use of the same duty cycle of 95 percent, when used for an RESS key-off check ("RESS-KOC", "400V, DC=0.95"), may produce the response of trace 76, where the voltage spread (ΔV) is about 180V. Here, the values of resistors R1, R2, and R3 from FIG. 8 are 200 kΩ, 6MΩ, and 6MΩ, respectively. Such a response is indicative of an excessive duty cycle. The controller 50 of FIG. 1 once again responds to this result in block B110 of FIG. 1A by adaptively reducing the PWM duty cycle, and in this manner adapts the bias resistance current. Knowledge of the bias resistance current and the voltage spread enables the controller 50 to calculate the isolation resistance. In turn, knowledge of the isolation resistance allows the controller 50 to execute a suitable control action responsive to a threshold low isolation resistance, such as by disconnecting the RESS 14, activating an audio and/or visual alert, etc.

The method 100 described above, when executed by the controller 50 of FIG. 1, is therefore intended to enable accommodation of a wide variety of possible isolation values of the motor vehicle 12 and/or the offboard DC charging station 20. Feedback control may be implemented to seek an optimized bias resistance. PWM control may be used to allow a lower-resistance bias resistor to functionally behave as a higher resistance by exploiting Y-capacitance properties of the electrical circuit 10 and the PWM duty cycle as set forth above. By adapting to the charging mode and using feedback control to optimize the isolation resistance current, active isolation detection is enabled that also maintains an acceptable signal-to-noise ratio.

As will be appreciated by those of ordinary skill in the art in view of the foregoing disclosure, the present teachings also enable comparison of "fault" responses to "fault free" baselines in order facilitate fault diagnostics and isolation. For instance, certain electrical faults described above, e.g., shorts, imbalances, etc., are able to create a voltage shift that is large enough to perform active isolation detection algorithms only by imparting a significantly higher PWM duty cycle to the switch that is used with the bias resistor. This quality enables the controller 50 or another control device to identify particular types of faults, e.g., by examining the duty cycle-voltage shift relationship, and to execute control actions responsive to such diagnostics. The method 100 may therefore include identifying a fault condition from a plurality of different possible fault conditions based on the duty cycle.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. An active isolation detection method for use with an electrical system having a battery pack connected to a high-voltage bus having a positive bus rail and a negative bus rail, each of the positive bus rail and the negative bus rail having a respective rail-to-ground voltage, the method comprising:
connecting a variable resistance element to the high-voltage bus;
determining input information, via a controller, wherein the input information is indicative of at least one electrical characteristic of the battery pack, the high-voltage bus, and/or a charging station;
wherein the battery pack is configured to form a first voltage pack when battery modules are connected in parallel, and the battery pack is configured to form a second voltage pack when the battery modules are connected in series;
varying a bias resistance of the high-voltage bus, via the variable resistance element, to produce a varied bias resistance based on the input information, and to thereby achieve a target voltage shift on the high-voltage bus, wherein the target voltage shift is a target level of change in the respective rail-to-ground voltage of one of the positive bus rail and the negative bus rail;
determining an isolation resistance of the electrical system, via the controller, using the varied bias resistance; and
wherein the variable resistance element includes a bias resistor and a binary switch connected to each other in series, wherein the binary switch has an open state and a closed state that is controlled using a pulse-width-modulation (PWM) switching control signal via the controller, and wherein varying the bias resistance includes selectively adjusting a PWM duty cycle of the binary switch based on whether the battery modules are connected in parallel or connected in series, using the PWM switching control signal which is adapted in real-time.

2. The method of claim 1, wherein varying the bias resistance includes selectively adjusting the PWM duty cycle of the binary switch based on the input information about the at least one electrical characteristic of the battery pack and the high-voltage bus, using the PWM switching control signal.

3. The method of claim 2, further comprising:
prior to adjusting the PWM duty cycle, measuring a first voltage between the positive bus rail or the negative bus rail and an electrical ground while the binary switch is in the open state;
after measuring the first voltage, applying the PWM switching control signal to the binary switch via the controller as a function of the input information;
measuring a second voltage between the high-voltage bus and the electrical ground while applying the PWM switching control signal to the binary switch to switch to the open state and the closed state multiple times while measuring the second voltage;
determining an actual voltage shift via the controller as a difference between the first voltage and the second voltage;
adjusting the PWM switching control signal in response to a threshold difference between the actual voltage shift and the target voltage shift to produce an adjusted voltage shift; and
using the adjusted voltage shift to determine a target bias resistance.

4. The method of claim 3, wherein adjusting the PWM switching control signal includes increasing or decreasing the PWM duty cycle when the actual voltage shift is lower or higher than the target voltage shift, respectively.

5. The method of claim 4, wherein adjusting the PWM switching control signal is conducted by the controller in proportion to an amount by which the actual voltage shift differs from the target voltage shift.

6. The method of claim 3, further comprising adjusting the PWM switching control signal in response to a difference between a time rate of change of the actual voltage shift and a target time rate of change of the target voltage shift.

7. The method of claim 1, wherein the at least one electrical characteristic includes one or more of a voltage capability of the battery pack, a charging voltage present on the high-voltage bus, and/or a present charging or discharging operating mode of the battery pack.

8. The method of claim 1, further comprising executing a control action with respect to the electrical system when the isolation resistance determined using the varied bias resistance is less than a threshold isolation resistance, including recording a diagnostic code.

9. The method of claim 8, wherein the control action includes identifying a fault condition from among a plurality of different possible fault conditions based on the PWM duty cycle.

10. The method of claim 1, wherein the electrical system is part of a vehicle having a chassis, and wherein an electrical ground is the chassis.

11. The method of claim 1, wherein:
the charging station is a first voltage charging station or a second voltage charging station being different from the first voltage charging station;
the battery pack is chargeable by either of the first voltage charging station and the second voltage charging station; and
varying the bias resistance includes selectively adjusting the PWM duty cycle of the binary switch based on whether the charging station is the first voltage charging station or the second voltage charging station, using the PWM switching control signal.

12. An electrical system comprising:
an electrical ground;
a variable resistance element having a binary switch connected in series with a bias resistor;
a high-voltage bus having a positive bus rail and a negative bus rail, each of the positive bus rail and the negative bus rail having a respective rail-to-ground voltage, wherein the binary switch and the bias resistor are positioned on the high-voltage bus;
a battery pack connected to the high-voltage bus, wherein the battery pack is configured to form a first voltage pack when battery modules are connected in parallel, and the battery pack is configured to form a second voltage pack when the battery modules are connected in series;
a voltage sensor connected to the high-voltage bus and configured to measure a voltage between the positive bus rail or negative bus rail and the electrical ground;
a controller in communication with the binary switch and the voltage sensor, wherein the controller is configured to:
determine input information indicative of an electrical characteristic of the battery pack, the high-voltage bus, and/or an offboard charging station;
vary a level of a bias resistance of the high-voltage bus, via control of a duty cycle of the binary switch that opens and closes the binary switch multiple times, to produce a varied bias resistance based on the input information, and to thereby achieve a target voltage shift on the high-voltage bus, wherein the target voltage shift is a target level of change in the respective rail-to-ground voltage of one of the positive bus rail and the negative bus rail, and wherein the duty cycle is selectively adjusted based on whether the battery modules are connected in parallel or connected in series;

determine an isolation resistance of the electrical system using the varied bias resistance;

measure, via the voltage sensor, a first voltage between the high-voltage bus and the electrical ground, while the binary switch is in an open state prior to adjusting the duty cycle;

after measuring the first voltage, apply a switching control signal that is adapted in real-time to the binary switch as a function of the input information; and execute a control action in response to the isolation resistance, including recording a diagnostic code indicative of the isolation resistance; amd wherein the electrical characteristic includes one or more of a voltage capability of the battery pack, a charging voltage present on the high-voltage bus, and/or a present charging or discharging operating mode of the battery pack.

13. The electrical system of claim 12, wherein the controller is configured to identify a fault condition from among a plurality of different possible fault conditions based on the duty cycle.

14. The electrical system of claim 13, wherein the controller is configured to:

measure, via the voltage sensor, a second voltage between the high-voltage bus and the electrical ground after applying the switching control signal to the binary switch;

determine an actual voltage shift as a difference between the first voltage and the second voltage;

adjust the switching control signal in response to a threshold difference between the actual voltage shift and the target voltage shift to produce an adjusted voltage shift; and use the adjusted voltage shift to determine a target bias resistance.

15. The electrical system of claim 14, wherein the controller is configured to adjust the switching control signal in response to a difference between a time rate of change of the actual voltage shift and a target time rate of change of the target voltage shift.

16. The electrical system of claim 14, wherein the controller is configured to adjust the switching control signal by increasing or decreasing the duty cycle when the actual voltage shift is lower or higher than the target voltage shift, respectively.

17. The electrical system of claim 16, wherein the controller is configured to adjust the switching control signal in proportion to an amount by which the actual voltage shift differs from the target voltage shift.

18. The electrical system of claim 12, wherein the control action, when the isolation resistance determined using the bias resistance is less than a threshold isolation resistance, includes automatically disconnecting the battery pack from the high-voltage bus.

19. The electrical system of claim 12, wherein the electrical system is part of a chassis that is a motor vehicle chassis, and the electrical ground is the chassis.

20. The electrical system of claim 12, wherein the bias resistor has a first resistance to define a lower-resistance bias resistor that functionally behaves as a bias resistor having a second resistance higher than the first resistance to define a higher-resistance bias resistor due to the controller configured to control the duty cycle of the binary switch to vary the level of the bias resistance of the high-voltage bus.

* * * * *